United States Patent
Myong

(10) Patent No.: US 8,901,413 B2
(45) Date of Patent: Dec. 2, 2014

(54) PHOTOVOLTAIC DEVICE INCLUDING FLEXIBLE SUBSTRATE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 334 days.

(21) Appl. No.: 13/048,370

(22) Filed: Mar. 15, 2011

(65) Prior Publication Data

US 2011/0220197 A1    Sep. 15, 2011

(30) Foreign Application Priority Data

Mar. 15, 2010  (KR) .......................... 10-2010-0023005

(51) Int. Cl.
| | |
|---|---|
| H01L 31/0224 | (2006.01) |
| H01L 31/0392 | (2006.01) |
| H01L 31/0236 | (2006.01) |
| H01L 31/0368 | (2006.01) |
| H01L 31/075 | (2012.01) |

(52) U.S. Cl.
CPC .. *H01L 31/03926* (2013.01); *H01L 31/022425* (2013.01); *Y02E 10/545* (2013.01); *Y02E 10/548* (2013.01); *H01L 31/02366* (2013.01); *H01L 31/022466* (2013.01); *H01L 31/03685* (2013.01); *H01L 31/075* (2013.01)
USPC .............. 136/256; 136/255; 136/252; 438/97

(58) Field of Classification Search
USPC .............................. 136/256, 255, 252; 438/97
See application file for complete search history.

(56) References Cited

U.S. PATENT DOCUMENTS

| | | | | | |
|---|---|---|---|---|---|
| 4,663,495 | A | * | 5/1987 | Berman et al. ................. | 136/248 |
| 5,244,509 | A | * | 9/1993 | Arao et al. ..................... | 136/259 |
| 5,296,045 | A | * | 3/1994 | Banerjee et al. ............... | 136/249 |
| 5,453,135 | A | * | 9/1995 | Nakagawa et al. ............ | 136/259 |
| 5,589,403 | A | * | 12/1996 | Toyama et al. ................. | 438/71 |
| 2005/0016583 | A1 | * | 1/2005 | Blieske et al. ................. | 136/256 |
| 2005/0039788 | A1 | * | 2/2005 | Blieske et al. ................. | 136/246 |
| 2007/0151596 | A1 | * | 7/2007 | Nasuno et al. ................. | 136/256 |
| 2008/0163917 | A1 | * | 7/2008 | Rech et al. ..................... | 136/244 |
| 2008/0185036 | A1 | * | 8/2008 | Sasaki et al. ................... | 136/252 |
| 2008/0196761 | A1 | * | 8/2008 | Nakano et al. ................. | 136/258 |
| 2009/0194155 | A1 | * | 8/2009 | den Boer et al. .............. | 136/256 |
| 2009/0194157 | A1 | * | 8/2009 | den Boer et al. .............. | 136/256 |
| 2009/0320910 | A1 | * | 12/2009 | Matsui et al. .................. | 136/252 |
| 2010/0269897 | A1 | * | 10/2010 | Sakai et al. .................... | 136/255 |

FOREIGN PATENT DOCUMENTS

JP        2003-347572 A  * 12/2003  .............. H01L 31/04

OTHER PUBLICATIONS

Fukuda et al., JP 2003-347572 A online machine translation, translated on Nov. 19, 2012.*

* cited by examiner

*Primary Examiner* — Golam Mowla
(74) *Attorney, Agent, or Firm* — H.C. Parks & Associates, PLC

(57) ABSTRACT

Disclosed is a photovoltaic device. The photovoltaic device includes: a flexible substrate; a first electrode and a second electrode located over the flexible substrate; and at least one unit cell located between the first electrode and the second electrode, wherein the first electrode includes a transparent conductive oxide layer, wherein a texturing structure is formed on the transparent conductive oxide layer, and wherein a ratio of a root mean square (rms) roughness to an average pitch of the texturing structure is equal to or more than 0.05 and equal to or less than 0.13.

10 Claims, 2 Drawing Sheets

PHOTOVOLTAIC DEVICE INCLUDING FLEXIBLE SUBSTRATE AND METHOD FOR MANUFACTURING THE SAME

CROSS-REFERENCE TO RELATED APPLICATIONS

This application claims priority under 35 U.S.C. §119 to Korean Patent Application No. 10-2010-0023005 filed on Mar. 15, 2010, the entirety of which is hereby incorporated by reference.

FIELD OF THE INVENTION

This embodiment relates to a photovoltaic device including a flexible substrate and a method for manufacturing the same.

BACKGROUND OF THE INVENTION

Recently, as existing energy resources like oil and coal and the like are expected to be exhausted, much attention is increasingly paid to alternative energy sources which can be used in place of the existing energy sources. As an alternative energy source, sunlight energy is abundant and has no environmental pollution. Therefore, more and more attention is paid to the sunlight energy.

A photovoltaic device, that is, a solar cell directly converts sunlight energy into electrical energy. The photovoltaic device mainly uses photovoltaic effect of semiconductor junction. In other words, when light is incident on and absorbed by a semiconductor p-i-n junction doped with p-type impurity and n-type impurity respectively, light energy generates electrons and holes within the semiconductor and the electrons and the holes are separated from each other by an internal field. As a result, a photo-electro motive force is generated between both ends of the p-i-n junction. Here, when electrodes are formed at both ends of the junction and connected with wires, electric current flows externally through the electrodes and the wires.

In order that the existing energy sources such as oil is substituted with the sunlight energy source, it is necessary to provide a photovoltaic device with high photovoltaic conversion efficiency.

SUMMARY OF THE INVENTION

One aspect of the present invention is a photovoltaic device. The photovoltaic device includes: a flexible substrate; a first electrode and a second electrode located over the flexible substrate; and at least one unit cell located between the first electrode and the second electrode, wherein the first electrode includes a transparent conductive oxide layer, wherein a texturing structure is formed on the transparent conductive oxide layer, and wherein a ratio of a root mean square (rms) roughness to an average pitch of the texturing structure is equal to or more than 0.05 and equal to or less than 0.13.

Another aspect of the present invention is a method for manufacturing a photovoltaic device. The method includes: forming a first electrode on a flexible substrate; forming at least one unit cell on the first electrode; and forming a second electrode on the at least one unit cell, wherein, in the formation of the first electrode, a deposition of the first electrode and a dry-etching of the deposited first electrode are repetitively performed.

DETAILED DESCRIPTION

An embodiment of the present invention will be described in detail with reference to the drawings.

Figure 1:
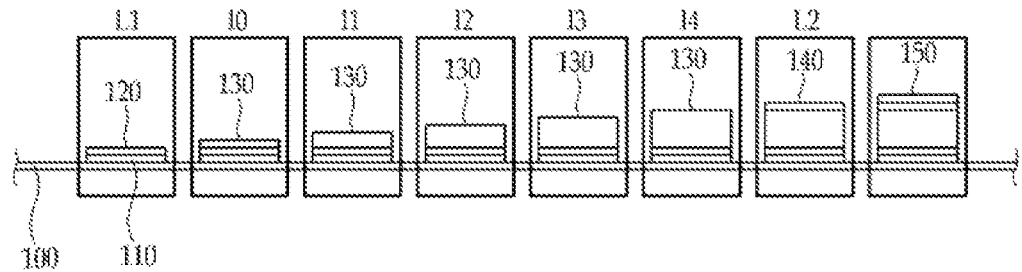
FIG. 1 shows a photovoltaic device according to an embodiment of the present invention and a method for manufacturing the same.

FIG. 1 shows a photovoltaic device according to an embodiment of the present invention and a method for manufacturing the same. A manufacturing system shown in FIG. 1 is used to form a photovoltaic device including a flexible substrate 100. The flexible substrate 100 is rolled in a roll (not shown). As the roll rotates, the flexible substrate 100 is unwound from the roll and is transferred into process chambers L1, I0 to I4 and L2. The flexible substrate 100 may be a metal foil substrate or a polymer substrate, and may have a light transmitting property.

A first electrode 110 is formed on the flexible substrate 100.

The flexible substrate 100 on which the first electrode 110 is formed is transferred to the process chambers L1, I0 to I4 and L2. A unit cell is formed in the process chambers L1, I0 to I4 and L2. The unit cell includes a first conductive semiconductor layer 120, an intrinsic semiconductor layer 130 and a second conductive semiconductor layer 140. The first conductive semiconductor layer 120, the intrinsic semiconductor layer 130 and the second conductive semiconductor layer 140 are formed respectively in the process chamber L1, the process chambers I0 to I4 and the process chamber L2.

When the first conductive semiconductor layer 120 and the second conductive semiconductor layer 140 respectively correspond to a p-type semiconductor layer and an n-type semiconductor layer, not only group III impurity gas but also hydrogen gas and silane gas are be introduced into the process chamber L1, and not only group V impurity gas but also hydrogen gas and silane gas are introduced into the process chamber L2. In such a p-i-n type photovoltaic device, light is incident through the substrate 100.

Further, when the first conductive semiconductor layer 120 and the second conductive semiconductor layer 140 respectively correspond to a n-type semiconductor layer and a p-type semiconductor layer, not only group V impurity gas but also hydrogen gas and silane gas are introduced into the process chamber L1, and not only group III impurity gas but also hydrogen gas and silane gas are introduced into the process chamber L2. In such an n-i-p type photovoltaic device, light is incident from the opposite side to the substrate 100.

Though the photovoltaic device including one unit cell is described in the embodiment of the present invention, it is possible to manufacture a tandem type photovoltaic device including a plurality of unit cells when process chambers for forming another unit cell are added.

After the unit cell is formed, a second electrode 150 is formed on the unit cell. Accordingly, one or more unit cells may be placed between the first electrode 110 and the second electrode 150.

The formation of the first electrode 110 will be described in detail below with reference to a separate drawing.

Figure 2:
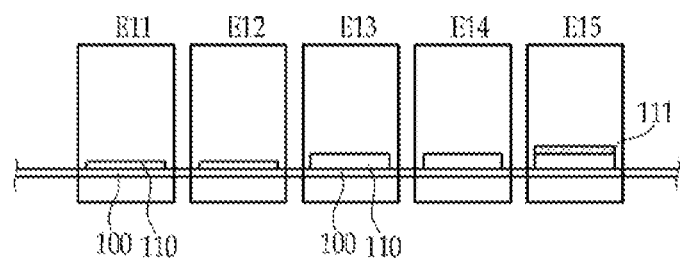
FIG. 2 shows processes of forming a first electrode and a second electrode of the photovoltaic device according to the embodiment of the present invention.

FIG. 2 shows processes for forming the first electrode and the second electrode of the photovoltaic device according to the embodiment of the present invention. As shown in FIG. 2, the first electrode 110 of the photovoltaic device according to an embodiment of the present invention may be formed in a step manner. That is, in the formation of the first electrode 110, the depositing of the first electrode 110 and a thy-etching of the deposited first electrode 110 are repetitively performed. The photovoltaic device according to the embodiment of the present invention may include a flexible substrate 100. The flexible substrate 100 like a polymer substrate can be transformed or damaged by chemical etching. Therefore, in the embodiment of the present invention, the flexible substrate 100 can be protected by using dry etching.

For example, the first electrode 110 including a transparent conductive oxide layer is deposited in a process chamber E11, and then an etching process for the deposited first electrode 110 is performed in a process chamber E12. The depositing and etching of the first electrode 110 are repetitively performed in process chambers E13 and E14. Accordingly, the thickness of the electrode in the process chamber E13 is larger than the thickness of the electrode in the process chamber E11.

Meanwhile, when the embodiment of the present invention is applied to an n-i-p type photovoltaic device, light is incident through the second electrode 150 opposite to the substrate 100. Therefore, the first electrode 110 may or may not have light transmittance.

When the first electrode 110 does not have light transmittance, a portion of the first electrode 110 may include an opaque material layer like a metal layer. For example, when a portion of the first electrode 110 includes an opaque material layer like a metal layer, the first electrode 110 includes, as shown in FIG. 2, a transparent conductive oxide layer located between the opaque material layer and the flexible substrate 100 for the purpose of increasing adhesion strength between the opaque material layer and the flexible substrate 100.

If the first electrode 110 does not include an opaque material layer, the photovoltaic device according to the embodiment of the present invention can be manufactured without a process chamber E15 of FIG. 2.

When the first electrode 110 includes the transparent conductive oxide layer like ZnO or ITO, the surface of the transparent conductive oxide layer is textured. In other words, when the transparent conductive oxide layer is deposited by chemical vapor deposition (CVD), a texturing structure like shown in FIG. 3 is formed on the surface of the transparent conductive oxide layer.

Figure 3:
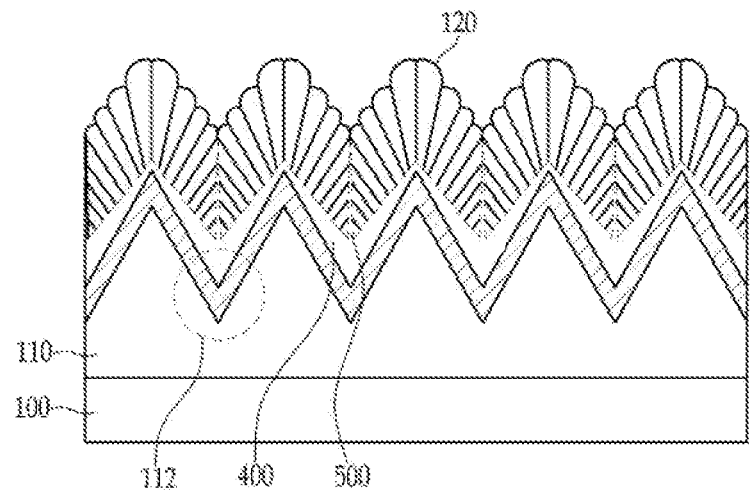
FIGS. 3 and 4 show texturing structures which are formed on the surface of a transparent conductive oxide layer before and after etching process.

As shown in FIG. 3, the first electrode 110 is deposited by chemical vapor deposition (CVD), and then a texturing structure 3 shaped like pyramid tips is formed on the surface of the first electrode 110. When the first conductive semiconductor layer 120 and the intrinsic semiconductor layer 130 which include hydrogenated microcrystalline silicon (μc-Si:H) are formed on the first electrode 110, the first conductive semiconductor layer 120 and the intrinsic semiconductor layer 130 are deposited in conformity with the texturing structure on the surface of the first electrode 110.

Here, V-shaped valley portion 112 of the texturing structure of the first electrode 110 functions as a crack to prevent the formation of microcrystal, and forms an amorphous incubation film 400 and a large volume of grain boundary 500. The incubation film 400 and the grain boundary 500 function as a center of recombination of photo-induced electron-hole pairs from microcrystalline silicon so that the overall characteristic of the photovoltaic device is deteriorated.

Therefore, in the embodiment of the present invention, after the texturing structure is formed on the surface of the first electrode 110, an etching process is performed. When the etching process is completed on the texturing structure of the electrode surface, a photovoltaic device shown in FIG. 4 is formed.

Figure 4:
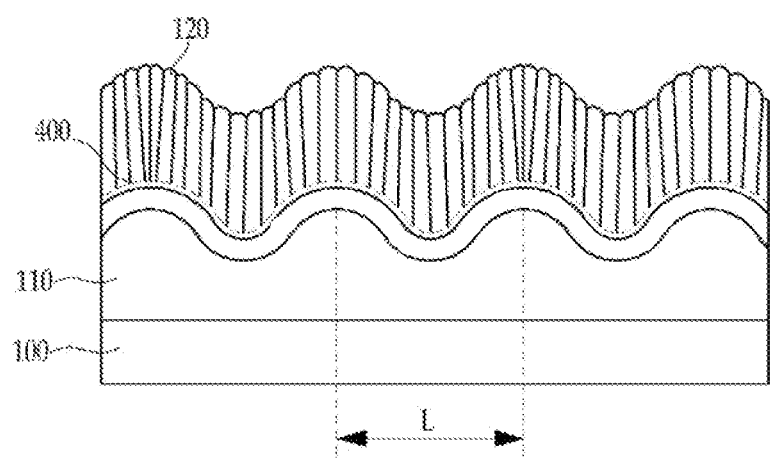

That is, as shown in FIG. 4, the surface texture shaped like a pyramid becomes smooth through the etching process. The surface texture shaped like a sharp pyramid is hereby transformed into a smooth surface texture having a "U" shape. When the microcrystalline silicon is deposited on the first electrode 110 having the smooth surface texture, the microcrystal is easily formed, and the incubation film 400 and a large volume of the grain boundary 500 are reduced. As a result, the characteristic of the photovoltaic device is improved.

Accordingly, since the etching is performed by using hydrogen plasma or argon plasma, the intrinsic semiconductor layer 130 of the photovoltaic device according to the embodiment of the present invention can include the hydrogenated microcrystalline silicon.

In the embodiment of the present invention, the hydrogen plasma etching or argon plasma etching can be performed in the process chambers E12 and 14. Regarding the hydrogen plasma etching, the hydrogen plasma is able to passivate grain boundary defects as well as to etch. As a result, carrier mobility is improved and stability of electrical conductivity in the air is enhanced as well. The hydrogen is a shallow level donor for the transparent conductive oxide like ZnO, thereby improving the conductivity of an n-type carrier of the first electrode 110.

A ratio of a root mean square (rms) roughness to an average pitch of the texturing structure formed on the surface of the transparent conductive oxide layer of the first electrode 110 is equal to or more than 0.05 and equal to and less than 0.13. The pitch of the texturing structure is, as shown in FIG. 4, a distance L between two adjacent projections. The average pitch of the texturing structure is a mean value of the pitches. After surface profile of a certain area is measured by using an atomic force microscope (AFM), the tins roughness is obtained through the following expression.

$$\text{rms roughness} = \frac{1}{N}\sum_{i=1}^{N}\sqrt{(Xi - \overline{X})^2}$$

Here, $X_i$ is a measured surface height. $\overline{X}$ is an average surface height.

When a ratio of the rms roughness to the average pitch is less than 0.05, the surface texture of the transparent conductive oxide layer is excessively smoothened, and light scattering effect caused by the first electrode 110 and adhesion strength between the substrate 100 and an opaque material layer 111 may be reduced. When a ratio of the rms roughness to the average pitch is more than 0.13, the texturing structure becomes excessively rough so that an amorphous incubation film 400 and a large volume of the grain boundary 500 may be formed.

As described above, when the ratio of the rms roughness to the average pitch of the texturing structure is equal to or more than 0.05 and equal to or less than 0.13, the thickness of the transparent oxide layer is equal to or more than 1 μm and equal to or less than 4 μm. The thickness of the transparent oxide layer formed by once performing the depositing and etching process is equal to or more than 250 nm and equal to or less than 1000 nm.

In measuring the transparent oxide layer of the first electrode 110, which is formed through the etching and passivation by the hydrogen plasma, by X-Ray Diffraction (XRD) in θ-2θ geometry, when an intensity of a peak corresponding to ($11\bar{2}0$) plane is greater than an intensity of peaks corresponding to (0002) and $(10\bar{1}0)$ planes, the pyramid-shaped texturing structure is formed. Accordingly, a ratio of the rms roughness to the average pitch of the texturing structure may become equal to or more than 0.05 and equal to or less than 0.13 through the etching process.

In a case where the transparent oxide layer formed through the etching and passivation by the hydrogen plasma is composed of ZuO, when a structural analysis and a composition analysis with respect to the depth of ZnO are performed by an X-ray Photoelectron Spectroscopy (XPS), an AUGER electron spectroscope and a Secondary Ion Mass Spectrometer (SIMS), a ratio of Zn/O is equal to or more than 1.1 and equal to or less than 1.3. When the ratio of Zn/O is equal to or less than 1.3, optical transmittance can be prevented from rapidly being reduced. When the ratio of Zn/O is equal to or more than 1.1, electrical conductivity can be prevented from rapidly being reduced due to the stoichiometric structure.

In a case where the transparent oxide layer formed through the etching and passivation by the hydrogen plasma is composed of ZnO, a hydrogen containing concentration of the transparent oxide layer is equal to or higher than $10^{19}/cm^3$ and equal to or less than $10^{21}/cm^3$. As described above, hydrogen is a shallow level donor in ZnO. The hydrogen can improve the conductivity of ZnO and passivate defects such as oxygen vacancy. When the hydrogen containing concentration is less than $10^{19}/cm^3$, the improvement of ZnO conductivity and the passivation effect are deteriorated. When the hydrogen containing concentration is greater than $10^{21}/cm^3$, mobility is reduced due to impurity scattering and optical transmittance of light with a wavelength longer than 1000 nm is reduced due to the free carriers-absorption (FCA).

A resistivity of the transparent oxide layer formed through the etching and passivation by the hydrogen plasma is equal to or less than $2\times10^{-3}$ Ωcm, and mobility of the transparent oxide layer is equal to or greater than 25 $cm^2/Vsec$. Since the transparent oxide layer in the embodiment of the present invention is etched and passivated by the hydrogen plasma, it can be seen that the resistivity is reduced and the carrier mobility is improved.

In the embodiment of the present invention as described above, after the transparent oxide layer is etched and passivated by the hydrogen plasma, a haze ratio of the transparent oxide layer is equal to or greater than 5% and equal to or less than 20% with respect to light having a wavelength of 600 nm. In addition, a transmittance of the transparent oxide layer is equal to or greater than 80% with respect to light in the wavelength range from 400 nm to 800 nm.

The photovoltaic device according to the embodiment of the present invention may further include a ZnMgO layer contacting with one side among both sides of the first electrode 110, which is closer to a light incident side. Accordingly, in a p-i-n type photovoltaic device, the ZnMgO layer is located between the flexible substrate 100 and the first electrode 110. In an n-i-p type photovoltaic device, the ZnMgO layer is also located between the unit cell and the first electrode 110. The refractive index of the ZnMgO layer is less than that of the transparent oxide layer. Therefore, when light is incident through the ZnMgO layer to the transparent oxide layer, light reflection is reduced. Here, metal organic solution including hydrogen, oxygen and Zn can be used as a Zn Source. Metal organic solution including Mg can be used as a Mg source. Water or alcohol and the like can be used as an O source.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of devices. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A photovoltaic device comprising:
   a flexible substrate;
   a first electrode and a second electrode located over the flexible substrate; and
   at least one unit cell located between the first electrode and the second electrode; and
   an incubation film having a uniform thickness and located between the first electrode and the at least one unit cell,
   wherein the first electrode comprises a transparent conductive oxide layer,
   wherein a texturing structure is formed on the transparent conductive oxide layer,
   wherein a ratio of a root mean square (rms) roughness to an average pitch of the texturing structure is equal to or more than 0.05 and equal to or less than 0.13,
   wherein the root mean square (rms) roughness is $$\text{root mean square (rms) roughness} = \frac{1}{N}\sum_{i=1}^{N}\sqrt{(Xi-\overline{X})^2}$$

where X is a measured surface height, $\overline{X}$ is an average surface height, and N is a natural number.

2. The photovoltaic device of claim 1, wherein the first electrode includes an opaque material layer and the transparent conductive oxide layer located between the opaque material layer and the flexible substrate.

3. The photovoltaic device of claim 1, wherein an intrinsic semiconductor layer of the at least one unit cell comprises hydrogenated microcrystalline silicon.

4. The photovoltaic device of claim 1, wherein a thickness of the transparent conductive oxide layer is equal to or more than 1 μm and equal to or less than 4 μm.

5. The photovoltaic device of claim 1, wherein, when measuring the first electrode by X-Ray Diffraction (XRD) in θ-2θ geometry, an intensity of a peak corresponding to ($11\bar{2}0$) plane is greater than an intensity of peaks corresponding to (0002) and $(10\bar{1}0)$ planes.

6. The photovoltaic device of claim 1, wherein the transparent conductive oxide layer is composed of ZnO, and wherein a ratio of Zn/O is equal to or more than 1.1 and equal to or less than 1.3.

7. The photovoltaic device of claim 1, wherein the transparent conductive oxide layer is composed of ZnO, and wherein a hydrogen containing concentration of the transparent conductive oxide layer is equal to or more than $10^{19}/cm^3$ and equal to or less than $10^{21}/cm^3$.

8. The photovoltaic device of claim 1, wherein a resistivity of the transparent conductive oxide layer is equal to or less than $2\times10^{-3}$ Ωcm, and wherein a mobility of the transparent conductive oxide layer is equal to or greater than 25 $cm^2$/Vsec.

9. The photovoltaic device of claim 1, wherein a haze ratio of the transparent conductive oxide layer is equal to or more than 5% and equal to or less than 20% with respect to light having a wavelength of 600 nm, and wherein a transmittance of the transparent conductive oxide layer is equal to or more than 80% with respect to light in the wavelength range from 400 nm to 800 nm.

10. The photovoltaic device of claim 1, further comprising a ZnMgO layer contacting with one side among both sides of the first electrode, which is closer to a light incident side.

* * * * *